United States Patent [19]
Hollesen et al.

[11] Patent Number: 5,065,692
[45] Date of Patent: Nov. 19, 1991

[54] SOLDER FLUX APPLICATOR

[75] Inventors: David B. Hollesen, Easton, Pa.; Joseph W. Kaczorek, Neshanic Station; Edwin S. Treible, Ringoes, both of N.J.

[73] Assignee: AT&T Bell Laboratories, Murray Hill, N.J.

[21] Appl. No.: 516,635

[22] Filed: Apr. 30, 1990

[51] Int. Cl.$^5$ .............................................. B05B 15/02
[52] U.S. Cl. .................................. 118/302; 118/323; 239/114; 239/210
[58] Field of Search ............... 239/112, 114, 209, 210; 68/205 R; 134/167 C; 118/302, 323

[56] References Cited

U.S. PATENT DOCUMENTS

| | | | |
|---|---|---|---|
| 2,777,419 | 1/1957 | Paasche | 118/323 |
| 2,899,929 | 8/1959 | Monroe | 118/302 |
| 3,111,715 | 11/1963 | Hofer | 118/323 |
| 3,112,723 | 12/1963 | Potocki | 113/95 |
| 3,122,117 | 2/1964 | Marzullo et al. | 113/95 |
| 3,769,232 | 10/1973 | Houldridge | 239/112 |
| 4,821,948 | 4/1989 | Fisher et al. | 228/223 |
| 4,871,105 | 10/1989 | Fisher et al. | 228/33 |

FOREIGN PATENT DOCUMENTS 88117628  9/1989  European Pat. Off. .
7626336 11/1978  Fed. Rep. of Germany .

OTHER PUBLICATIONS

SEHO Sales Literature (date unknown).

Primary Examiner—Richard V. Fisher
Assistant Examiner—Charles Friedman
Attorney, Agent, or Firm—R. B. Levy

[57] ABSTRACT

An apparatus (10) for spraying a liquid, such as a low-solids flux, onto a substrate (12), during its transit along a first path (15), comprises a spray gun (38) directed at the substrate. The gun (38) is carried by a carriage (34) reciprocated by a traversing mechanism (42,44,46) which reciprocates the gun back and forth along a second path (30) generally perpendicular to the first path (15). The spray gun (38) is reciprocated such that its spray pattern during each pass slightly overlaps the pattern made during the previous pass, thereby achieving substantially uniform liquid coating on the substrate. Each time the gun (38) reaches an end of its travel, its tip (39) is advantageously cleaned automatically by a brush (84) wetted by a solvent to avoid tip clogging.

3 Claims, 4 Drawing Sheets

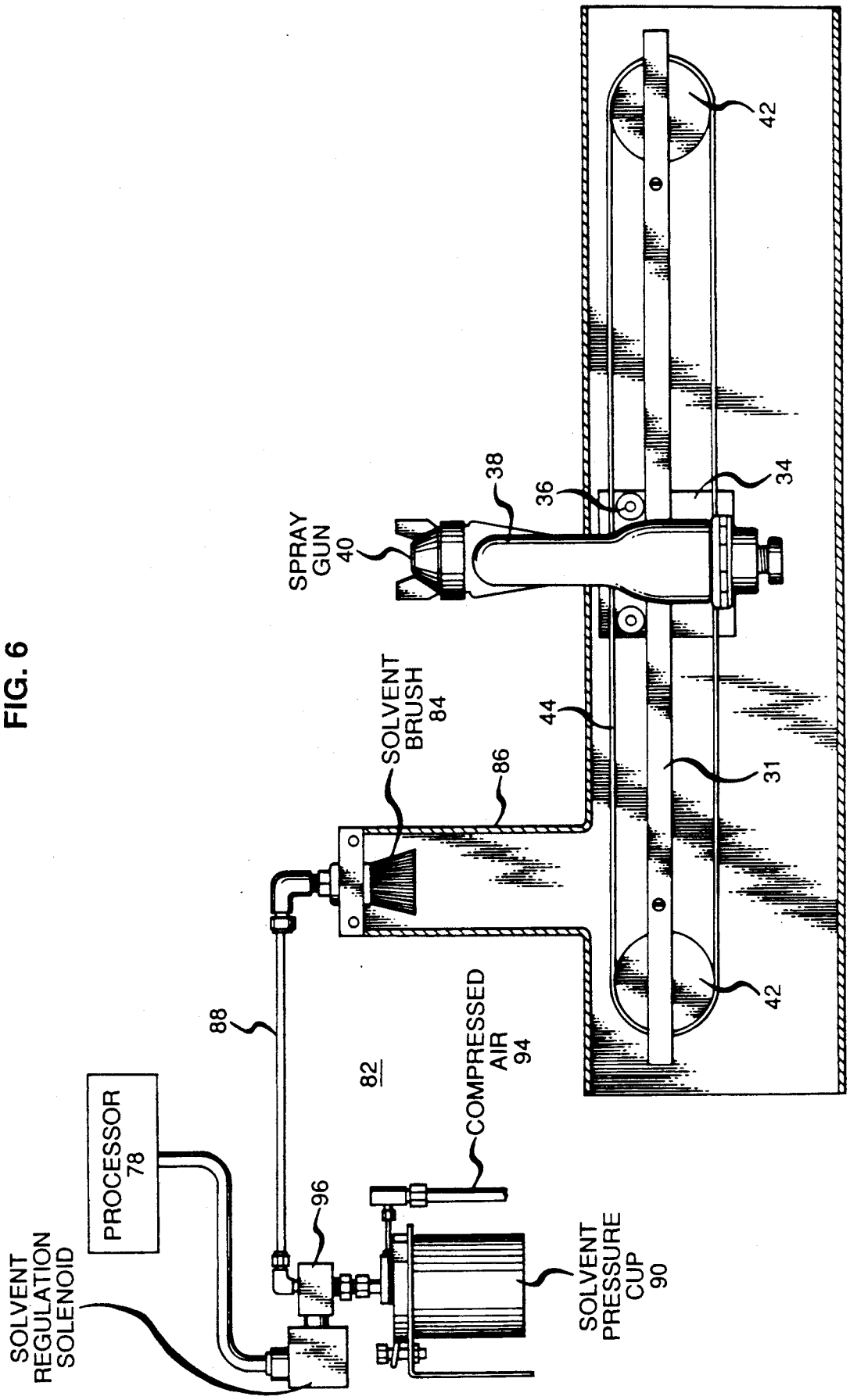

SOLDER FLUX APPLICATOR

TECHNICAL FIELD

This invention relates generally to a method and apparatus for applying a substantially uniform coating of a liquid, especially soldering flux, to a substrate.

BACKGROUND OF THE INVENTION

Within the electronics industry, soldering remains the technique of choice for bonding the leads of an electronic component to a corresponding pattern of metallized areas on a printed circuit board. In carrying out the soldering process, a quantity of solder flux is often applied either to the component leads, or more frequently, to the metallized areas on the circuit board. The flux, which is generally comprised of an activator, a solid vehicle, and a solvent, acts as both a wetting and cleaning agent to enhance the quality of the solder bond between the lead and metallized area on the circuit board. In the past, solder flux has been applied, by brushing, foaming, spraying, or alternatively, by producing a flux wave across which the circuit board is passed.

Traditionally, rosin-based fluxes, that is, fluxes which employ rosin, have been preferred because of their mild activity, as compared with more chemically active water-soluble fluxes. However, rosin-based fluxes incur the disadvantage that such fluxes leave residues which interfere with testing of the circuit board. Usually, the only way to remove such residues is by cleaning the circuit board with chlorofluorocarbons (CFC's), which are deleterious to the environment, or with harsh detergents which often must be treated before discharge into a municipal sewage system.

In an effort to overcome the cleaning difficulties associated with conventional rosin-fluxes, several manufacturers have introduced "low-solids" fluxes, which are a liquid flux mixture containing very small amounts of solids vehicle. Such low-solids fluxes have been found to leave much reduced amounts of residues, small enough so that testing of the circuit board is not adversely affected even without cleaning. However, the disadvantage of such low-solids fluxes is that unless applied in a very controlled fashion, the surface insulation resistance of the board may vary and thus fall below acceptable limits.

In U.S. Pat. Nos. 4,821,948 and 4,871,105, both issued in the names of John R. Fisher, Leslie A. Guth and James A. Mahler, and both assigned to AT&T, there is disclosed an apparatus for spraying a controlled amount of low-solids flux on a circuit board to avoid the aforementioned difficulty. The Fisher et al. apparatus employs an ultrasonic nozzle which atomizes the liquid low-solids flux into tiny droplets that are injected into a laminar gas stream directed through a horn towards the circuit board to deposit the flux thereon. While the Fisher et al. apparatus has proven effective to spray a controlled amount of low solids on a circuit board, the ultrasonic nozzle employed within the apparatus is relatively expensive. Moreover, the horn often becomes clogged, requiring manual cleaning.

Thus, there is a need for a less costly and more reliable apparatus for applying low-solids flux.

SUMMARY OF THE INVENTION

Briefly, in accordance with the invention, an apparatus is disclosed for applying a liquid (e.g., liquid low-solids flux) with substantial uniformity onto a substrate while the substrate is transported along a predetermined path of travel. The apparatus comprises a tank which contains liquid low-solids flux that is forced therefrom into a spray gun directed at the substrate for spraying a predetermined pattern of flux thereon. A traversing mechanism reciprocates the spray gun back and forth along a path generally perpendicular to the path of substrate travel such that the pattern of flux sprayed on the substrate during each pass at least partially overlaps the pattern deposited during the previous pass. In this way, flux is deposited on the substrate with substantial uniformity. The apparatus of the present invention is advantageously provided with a mechanism for automatically cleaning the tip of the spray gun as it is reciprocated to keep the tip free from clogging, thus assuring reliable, long term operation.

In accordance with another aspect of the invention, a method is disclosed for applying a liquid (e.g., liquid low-solids flux) onto a substrate with substantial uniformity, while the substrate is transported along a predetermined path of travel. The method is practiced by forcing liquid low-solids flux into a spray gun directed at the substrate so that the gun sprays a predetermined pattern of flux thereon. Simultaneously, the spray gun is reciprocated back and forth along a path generally perpendicular to the path of substrate travel so that the pattern of flux deposited during each pass at least partially overlaps the pattern deposited during the previous pass. In this way, the pattern of flux deposited is substantially uniform. The tip of the spray gun is advantageously cleaned automatically each time the spray gun is reciprocated to assure reliable, long term operation.

BRIEF DESCRIPTION OF THE DRAWING

FIG. 6 is a bottom view of the substrate of FIG. 1 showing the manner in which the flux-applying apparatus of FIG. 1 applies flux thereto.

DETAILED DESCRIPTION

Figure 1:
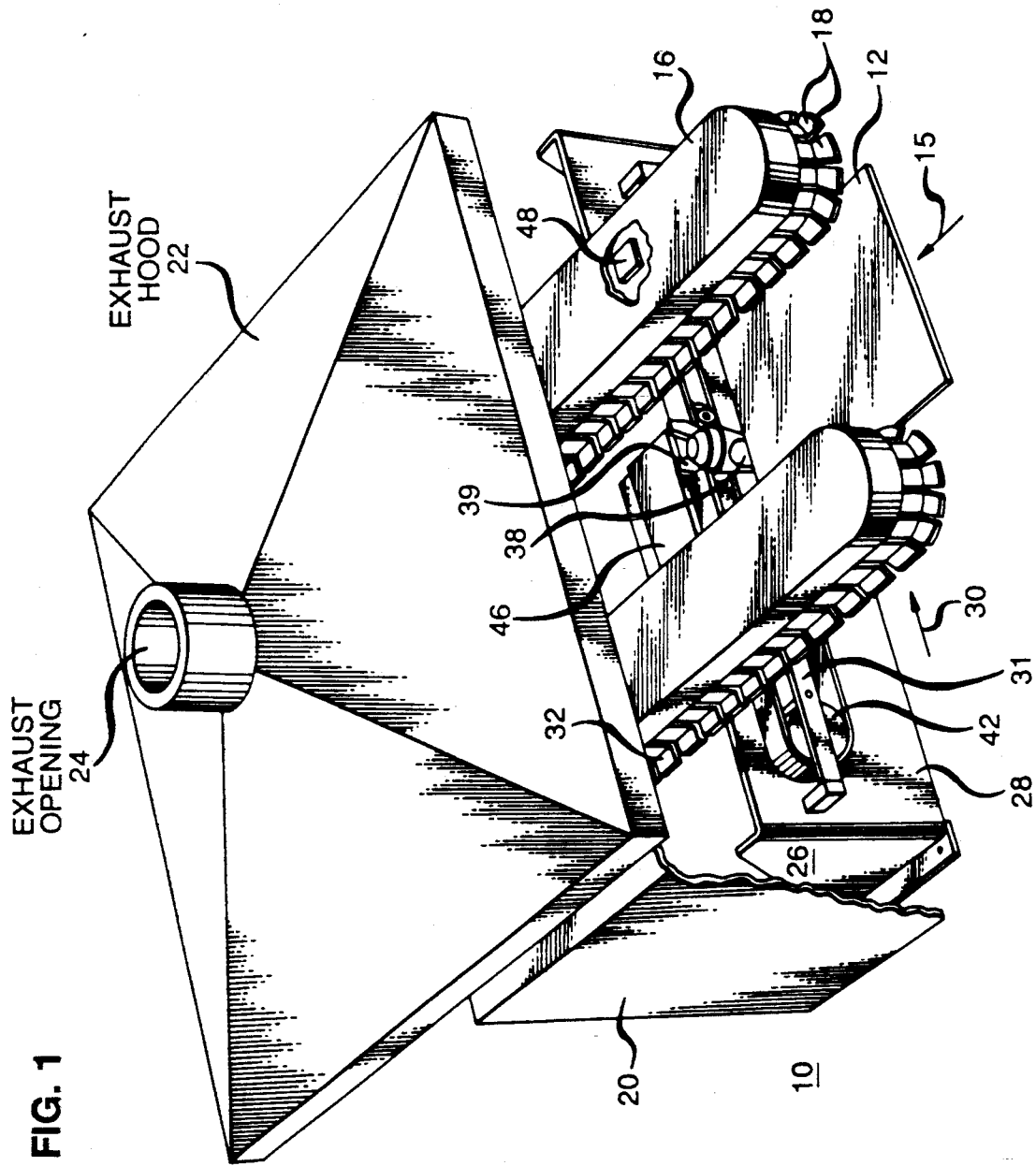
FIG. 1 is perspective view of an apparatus, in accordance with the present invention, for applying low-solids flux to a substrate.

Referring to FIG. 1, there is shown a perspective view of an apparatus 10, in accordance with the invention, for applying a liquid, such as liquid low-solids flux, onto a printed circuit board 12 with substantial uniformity as the board is carried by a conveyor 14, along a path 15, which typically leads into a wave soldering machine (not shown). The conveyor 14, which is not part of the apparatus 10, is comprised of two spaced-apart rails 16, each carrying an endless chain of "L"-shaped fingers 18, the lower portion of each finger serving to engage an opposite one of the edges of the circuit board 12. One of the rails 16 is movable from the other to accommodate different width circuit boards 12.

The flux applicator apparatus 10 is comprised of an open-top enclosure 20 seated a short distance below the conveyor 14. Overlying the enclosure 20 above the conveyor 14 is a pyramid-shaped hood 22 having an exhaust opening 24 at its peak connected to an exhaust vent (not shown). Situated within the enclosure 20 is a frame 26 having an upstanding vertical wall 28 which runs longitudinally along an axis 30 perpendicular to the axis 15 of travel of the circuit board 12. A horizontal rail 31 has each of its ends mounted by a separate one of a pair of pillow blocks 32 to the wall 28 so that the rail is spaced out from, and runs horizontally along, the wall parallel to the axis 30.

Figure 2:
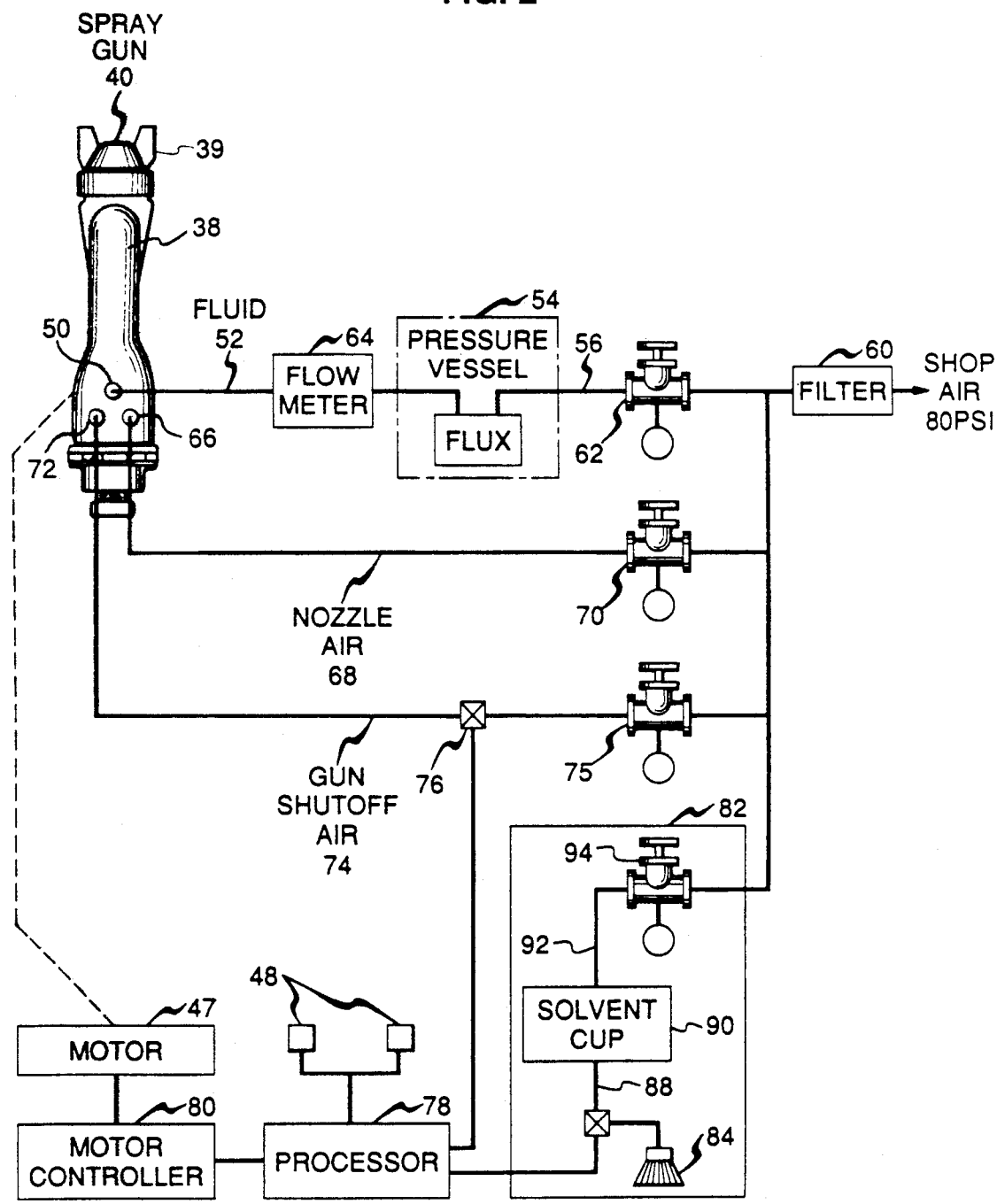
FIG. 2 is a schematic block diagram of the flux-applying apparatus of FIG. 1.
Figure 3:
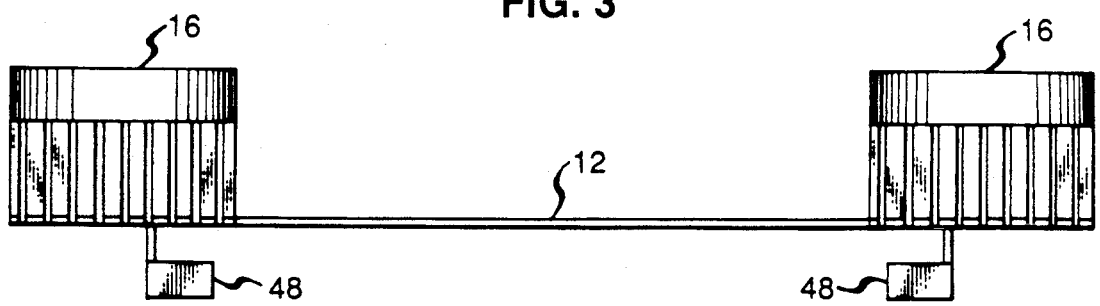
FIG. 3 is a frontal view of a portion of the flux-applying apparatus of FIG. 1 showing the details of a cleaning system associated therewith.

Referring now to FIG. 3, which is a partial front view of the apparatus 10 of FIG. 1, the rail 31 supports a carriage 34 having three rotatably mounted wheels 36 (only two shown) which roll on the rail so that the carriage may move therealong. The carriage 34 of FIG. 3 carries a spray gun 38 which is mounted vertically such that the gun has its spray tip 39 directed at the underside of the circuit 12 of FIG. 1. As will be described hereinafter in greater detail with respect to FIG. 2, the spray gun 38 serves to spray a liquid (e.g., liquid low-solids flux) onto the underside of the circuit board 12 on FIG. 1.

Figure 5:
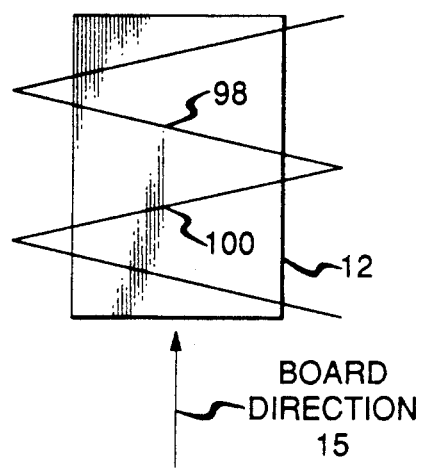
FIG. 5 is a side view of a portion of a carriage within the flux-applying apparatus of FIG. 1.

Referring to FIG. 3, each of a pair of sprockets 42 is rotatably journaled to the wall 28 so each lies between the wall and the rail 31 a short distance laterally inward from a separate one of the rail ends. Looped about the sprockets 42 is an endless chain 44, which, as best seen in FIG. 5, has a pin 45 extending horizontally outward from one of the chain links. The pin 45 rides in a vertical channel 46 on the back of the carriage 34 (the left-hand side in FIG. 5). As the particular link of the chain 44 carrying the pin 45 follows the radius of each sprocket 42 of FIG. 3, the pin moves within the channel, either downward or upward, depending on the direction of chain rotation. In this way, the carriage 34, and hence the spray gun 38, is continuously reciprocated back and forth along the rail 31 as the chain 44 is rotated in a single direction. As shown in FIG. 1, the right-hand one of the sprockets 42 is driven by an electric motor 47 to reciprocate the carriage 34 and spray gun 38 in the manner described. In a preferred embodiment, the motor 47 comprises a model P56H5040 AC motor made by Reliance Electric Company, Cleveland, Ohio.

Figure 4:
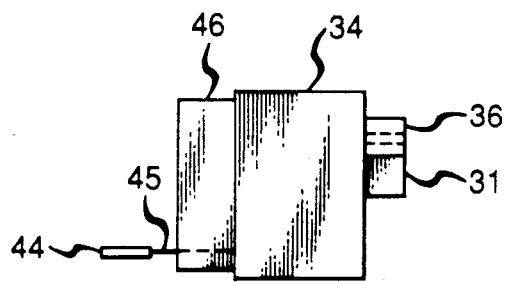
FIG. 4 is a partial front view of the flux-applying apparatus of FIG. 1 showing a pair of sensors for sensing the position of a spray gun comprising part of the apparatus of FIG. 1.

As will become apparent hereinafter, knowing the relative position of the carriage 34, and hence the spray gun 38 is useful. To that end, each of a pair of sensors 48 is mounted to a separate one of the conveyor rails 16 as seen in FIG. 4 so as to depend therefrom for actuation by the spray gun 38 when it passes thereunder. Information as to when the spray gun 38 crosses each conveyor rail 16 is used to control the operation of the gun so that the rails themselves are not totally sprayed.

FIG. 2 is a schematic diagram of the apparatus 10, showing additional details thereof. In a preferred embodiment, the spray gun 38 takes the form of a model 61 spray gun made by Binks Spray Systems of Philadelphia, Penn. The tip 39 is comprised of a Binks 66A air nozzle and model 9-096 fluid tip. This type of spray gun 38 has a fluid inlet 50 into which a liquid (i.e., low-solids flux) is supplied through a line 52 from a tank 54 containing a reservoir of low-solids flux. The flux in the tank 54 is pumped therefrom into the line 52 by forcing an inert gas (i.e., pressurized air) into the tank through a line 56 which is fed with compressed air from a supply (not shown) through a filter 60. A pressure gauge and regulator 62 is provided in the line 56 to control the pressure of the air entering the tank 54, which, in turn, controls the rate of flow of flux from the tank 54 into the line 52. The flow rate of flux through the line 52 is measured by a flow meter 64.

The flux entering the spray gun 38 through the inlet port 50 is discharged from the tip 39. The flux discharged from the tip 39 is atomized by an impinging air stream entering the spray gun through an inlet port 66, which is coupled by a line 68 to the output of the air filter 60. A pressure regulator and gauge 70 is provided in the line 68 to control the pressure of the air passing into the inlet 66.

The particular model spray gun 38 employed in the present embodiment has an internal, air-actuated valve (not shown) which controls the flow of fluid (i.e. low-solids flux) and atomizing air through the gun itself. This internal valve is actuated by the pressure of air entering a port 72 in the spray gun 38 from a line 74, which, like the lines 56 and 68, is supplied with compressed air from the supply through the filter 60. A pressure regulator and gauge 75 regulates the pressure of the air through the line 74.

A solenoid-operated valve 76 is situated in the line 74 to inhibit the flow of air into the port 72 during the interval while no flux is to be sprayed on the circuit board 12 of FIG. 1. The valve 76 is operated by a processor 78, which, in a preferred embodiment takes the form of a model SLC-150 programmable logic controller manufactured by Allen-Bradley Co., Milwaukee, Wis. The processor 78 also serves to control the motor 47 through a motor controller 80 that regulates the frequency of the motor excitation so as to control the motor speed, and hence the rate of traversal of the spray gun 38. In a preferred embodiment, the motor controller 80 takes the form of a model 1AC2101 motor controller made by Reliance Electric.

Control of the valve 76 by the processor 78 is achieved in accordance with signals from the sensors 48 so that the spray gun 38 is operative only while it is directly beneath the circuit board 12. From the signals supplied from the sensors 48, the processor 78 will know when the spray gun 38 has traveled beyond a separate one of the ends of the circuit board 12. Since the spray gun 38 is constantly reciprocated back and forth substantially the entire length of the rail 31, the gun would ordinarily spray the conveyor rails 16. To minimize this situation, the processor 78 controls the solenoid 76 in accordance with the activation of the sensors 48 so that the spray gun 38 is only operative to spray flux while directly under the circuit board 12.

In the course of fabricating the apparatus 10 thus far described, it was found that even while the spray gun 38 was operational for only a short interval, the tip 39 would clog with low-solids flux, resulting in erratic spraying. This problem was overcome, in accordance with the present invention, by providing the apparatus 10 with a cleaning system 82 shown in FIGS. 2 and 3 for automatically cleaning the tip 39 of the spray gun 38 as the gun is reciprocated back and forth along the rail 31 of FIG. 3. As best seen in FIG. 3, the cleaning system 82 comprises a brush 84 which is secured by a bracket 86 rising upwardly near one end of the wall 28 (the left-hand end in FIG. 1) such that the bristles of the brush will rub the tip 39 of the spray gun 38 when the gun is at its leftward end of travel.

The brush 84 is wetted with a solvent, typically alcohol, supplied to the brush through a line 88 from a solvent pressure cup 90 containing a volume of such solvent. Solvent from the cup 90 is pumped into the line 88 when an inert gas (i.e., pressurized air) is forced into the cup through a line 92, which as seen in FIG. 2, is coupled to the compressed air supply (not shown) through the filter 60. As seen in FIG. 2, a pressure regulator and gauge 94 is placed in the line 92 to control the air pressure.

A solenoid-operated valve 96 is provided within the line 88 to inhibit the flow of solvent to the brush 84. The valve 96, like the valve 76 of FIG. 2, is controlled by the processor 78. Typically, the processor 78 pulses the valve 96 to periodically keep the brush 84 wet with solvent. The frequency at which the valve 98 is pulsed is selected so that the brush 84 is kept wet (taking into account the rate at which the solvent evaporates) without incurring any dripping of solvent which would be wasteful.

Referring to FIG. 1, the spraying of the circuit board 12 with low-solids flux is carried out in the following manner. Typically, one or more circuit boards 12 are loaded onto the conveyor 14. Then, the conveyor 14 is started. Once the circuit board 12 has been transported by the conveyor 14 a short distance from the spray gun, as sensed by a proximity sensor (not shown), then the motor 47 is energized, causing the spray gun 38 to be reciprocated back and forth along the rail 31. The valve 76 of FIG. 2 is actuated during this time such that the spray gun 38 is operative to spray flux only during the intervals that the gun directly underlies the circuit board 12.

Referring to FIG. 6, while the spray gun 38 of FIGS. 1-3 is traversing underneath the circuit board 12 in opposite directions along the axis 30, the board itself is moving along the axis 15. Thus, since the spray gun 38 is traveling ar a right angle to the circuit board 12, the pattern of the flux sprayed by the spray gun 38 as the gun travel in a left-to-right direction appears as a diagonal stripe, as represented by a separate one of the lines 98 in FIG. 6. Similarly, when the spray gun 38 is traveling in a right-to-left direction, the spray pattern is also a diagonal stripe, which is represented by a separate one of the dark lines 100 in FIG. 6. The diagonal stripes 98 and 100 made by the spray gun 38 are angled opposite to each other, so that the practice, the tip 39 on the spray gun 38 sprays a band of flux that is 6" (15 cm) wide. Thus, each of the stripes 98 and 100, while shown as thin lines in FIG. 6, is approximately 6" wide. During each right-to-left pass of the spray gun 38, the tip 39 is automatically cleaned by the solvent-wetted brush 84.

The speed of the motor 47 (which determines the number of traversals or passes/min of the spray gun 38) as well as the speed of the conveyor 14 determines the degree to which the spray pattern made by the tip 39 of the gun during each pass overlaps the spray pattern made during the previous pass. To achieve substantially uniform deposition of flux onto the circuit board 12, the spray pattern made during each pass of the spray gun 38 must overlap the pattern made during the previous pass of the gun.

The relationship between the number of spray gun 38 passes per minute, the speed of the conveyor 14, the width of the spray pattern of the tip 39, and the percentage overlap of spray patterns is given by:

$$S = \frac{12V}{W(1 - P/100)}$$

where:
S is the number of passes/min of the spray gun 38 across the circuit board 12,
V is the velocity of the conveyor in feet/minute,
W is the width of the spray pattern of the tip 39 in inches,
P is the percentage overlap.

For example, to obtain 75% spray pattern overlap (P=75) at a conveyor speed of 3.125 feet/minute, given a spray width of 6", the spray gun 38 must make 25 passes per minute.

The foregoing describes an apparatus 10 for depositing a uniform coating of low-solids flux on a circuit board 12 as it is displaced along a first axis 15 by reciprocating a spray gun 38, directed at the board, along a second axis 30 perpendicular to the first one. As the spray gun 38 is reciprocated along the first axis, the tip 39 of the gun is advantageously cleaned automatically by a cleaning system 82, thus assuring reliable operation.

We claim:

1. Apparatus for depositing a liquid onto a substrate with substantial uniformity as the substrate is transported linearly along a predetermined path of travel, comprising:
   a first closed tank containing a volume of liquid;
   a spray gun directed at the substrate;
   means for pumping liquid from the tank into the gun so that the gun will spray the liquid in a predetermined pattern onto the substrate;
   traversing means for reciprocating the gun along a path generally perpendicular to the path of travel of the substrate so that the spray pattern made by the gun during each pass at least partially overlaps the pattern made during the previous pass of the gun in the opposite direction, thereby assuring substantial uniformity of deposition;
   a brush mounted to contact the gun at least once while the gun is being reciprocated;
   a second closed tank containing solvent; and
   means coupled to said second tank and said brush for automatically supplying solvent to the brush from the tank at periodic intervals so that the brush is continuously saturated with solvent.

2. The apparatus according to claim 1 wherein the brush is mounted to contact the tip of the spray gun when the gun has reached one of the ends of its travel.

3. The apparatus according to claim 1 wherein the solvent supplying means comprises:
   means for forcing an inert gas into the second tank;
   a conduit coupled between the second tank and the brush valve means;
   valve means disposed in said conduit for controlling the flow of solvent therethrough while inert gas is forced into said second tank; and
   means for periodically opening the valve means to wet the brush with solvent.

* * * * *